United States Patent [19]

Martin et al.

[11] 4,025,365

[45] May 24, 1977

[54] METHOD OF PRODUCING HOMOGENEOUSLY DOPED p-CONDUCTIVE SEMICONDUCTOR MATERIALS

[75] Inventors: Joachim Martin; Ernst Haas, both of Erlangen; Konrad Reuschel, Vaterstetten; Manfred Schnöller, Haimhausen, all of Germany

[73] Assignee: Siemens Aktiengesellschaft, Berlin & Munich, Germany

[22] Filed: Aug. 11, 1975

[21] Appl. No.: 603,678

[30] Foreign Application Priority Data

Aug. 16, 1974 Germany .................. 2439430

[52] U.S. Cl. .................. 148/1.5; 357/91
[51] Int. Cl.² .................. H01L 21/26

[58] Field of Search ............. 148/1.5, 187; 357/91

[56] References Cited

UNITED STATES PATENTS

| 2,666,814 | 1/1954 | Shockley ............. 148/1.5 X |
| 3,430,043 | 2/1969 | Blumenfeld et al. ......... 148/1.5 X |

*Primary Examiner*—L. Dewayne Rutledge
*Assistant Examiner*—John M. Davis
*Attorney, Agent, or Firm*—Hill, Gross, Simpson, Van Santen, Steadman, Chiara & Simpson

[57] ABSTRACT

A homogeneously doped p-conductive semiconductor material is produced by irradiating a desired semiconductor material with γ-photons which trigger nuclear reactions within such irradiated material to form dopant atoms therein.

8 Claims, No Drawings

METHOD OF PRODUCING HOMOGENEOUSLY DOPED p-CONDUCTIVE SEMICONDUCTOR MATERIALS

BACKGROUND OF THE INVENTION

1. Field of the Invention

The present invention relates to a process of producing homogeneously doped p-conductive semiconductor materials.

2. Prior Art

Doping of semiconductor materials (for example, silicon) is frequently conducted during deposition of the semiconductor material from the gas phase thereof by the thermal decomposition of a gaseous compound yielding the desired semiconductor material onto a heated mandrel. During this process, doping is typically effected by mixing a gaseous compound yielding a desired dopant upon decomposition with the gaseous compound yielding the desired semiconductor material so that the material deposited on the mandrel is a mixture of the semiconductor material and the dopant. Silicon rods produced in this manner are polycrystalline and must be converted into the monocrystalline state by a subsequent zone melt treatment. During this zone melt treatment the dopant concentration often changes in an uncontrollable manner and substantially higher dopant concentrations must be provided in forming the polycrystalline rods to insure that the desired dopant concentration still exists in the ultimately produced monocrystalline rods.

Germanium rods are typically produced via the Czochralski crucible-drawing method wherein a seed crystal is submerged into a germanium melt containing a suitable dopant therein within a crucible and a monocrystalline rod is drawn from the melt by upward movement of the seed crystal. In this process, it is also noted that the dopant evaporates in an uncontrollable manner during the crystal growth process.

Semiconductor bodies composed of $A^{III}B^V$ compounds, such as gallium arsenide or gallium phosphide, are frequently doped by producing a melt of the compound and a suitable dopant in a crucible or boat and drawing a suitable rod therefrom.

Such known doping processes are time-consuming and inaccurate. Accordingly, electrical components produced from such semiconductor materials are expensive and do not possess optimum electrical characteristics.

SUMMARY OF THE INVENTION

The invention provides a method of producing p-conductive semiconductor materials having a homogeneous dopant distribution throughout the semiconductor material body (i.e. in a rod, along the rod length and the rod cross-section independent of the diameter of the rod) in a simple, accurate, reproducible and economical manner.

By practicing the principles of the invention, extremely high ohmic semiconductor materials are readily produced. Previously, such materials could be produced only with extreme difficulty using conventional processes so that the resultant dopant material had relatively narrow radial and axial resistance tolerances.

In accordance with the principles of the invention, a select semiconductor material which is to be doped is irradiated with γ-protons which trigger nuclear reaction within such irradiated material to produce p-dopant atoms therein.

In one embodiment of the invention, silicon is irradiated with γ-protons whereby aluminum atoms are produced within the irradiated silicon so that a homogeneously doped p-conductive silicon body is attained.

In another embodiment of the invention, a gallium body is irradiated with γ-photons so as to produce germanium atoms therein and achieve a homogeneously doped p-conductive gallium body.

In yet another embodiment of the invention, a gallium arsenide, a gallium phosphide or a gallium arsenide phosphide body is irradiated with γ-photons so that zinc atoms are produced within such a body and a homogeneously doped p-conductive body is attained.

DESCRIPTION OF THE PREFERRED EMBODIMENTS

The invention provides a process of producing p-conductive semiconductor material which contains a homogeneous dopant distribution throughout the material in a simple, accurate, reproducible and economical manner. p-Conductive semiconductor materials produced in accordance with the principles of the invention are extremely ohmic and possess narrow radial and axial resistivity tolerances.

In accordance with the principles of the invention, select semiconductor material to be doped is irradiated with γ-photons whereby p-doping atoms are produced within the body by a nuclear reaction or reactions initiated or triggered by the γ-photons and a homogeneously doped p-conductive semiconductor body is attained.

In one embodiment of the invention, a silicon body is irradiated with γ-photons to produce aluminum atoms therein which act as a dopant to yield a p-doped silicon. The γ-photons trigger a reaction within the silicon body in accordance with the nuclear reaction:

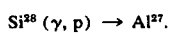

The natural isotope $Si^{28}$ contained in silicon is converted to the stable isotope $Al^{27}$ in accordance with the above nuclear reaction wherein protons are emitted.

In another embodiment of the invention, a germanium body is irradiated with γ-photons to produce gallium atoms therein so as to yield a p-doped germanium body. The nuclear reaction triggered by the γ-protons within the germanium body is as follows:

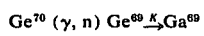

The natural isotope $Ge^{70}$ present in the germanium body is converted via the nuclear into the unstable isotope $Ge^{69}$ with the emission of neutrons. The $Ge^{69}$ isotope is converted into the stable isotope $Ga^{69}$, along with the emission of nuclear radiation (K). No further energy source or irradiation is required for this second stage.

In yet another embodiment of the invention, a body composed of a $A^{III} B^V$ compound, such as gallium arsenide, gallium phosphide or gallium arsenide phosphide, is irradiated with γ-photons so that zinc atoms forms therein. The nuclear reaction which takes place within such a body is as follows:

The stable isotope Ga$^{69}$ is converted into the unstable isotope Ga$^{68}$ with the emission of neutrons. The Ga$^{68}$ isotope is a $\beta^+$ emitter with a half-life period of 1.14 hours and is simultaneously converted into the stable isotope Zn$^{68}$. Again, no external energy source or further radiation is required to effect this transformation.

The concentration of dopant atoms produced in accordance with the principles of the invention is dependent upon the duration of the $\gamma$-photon irradiation and the photon current per unit area (photon current density). The product of these two parameters is referred to as "fluence".

Thus, for example, when starting with a germanium rod having a specific resistance of 47 $\Omega$ . cm (i.e. the intrinsic conductivity at 300° K), a desired resistance of 8.75 $\Omega$ . cm p-type may be produced as follows:

A 35 MeV electron beam of 100$\mu$A current density is positioned to strike a 0.6 cm thick tungsten target. The radiation produced by the retardation of the resultant electrons is used to irradiate the germanium rod and initiate or trigger the following nuclear reactions within such a body:

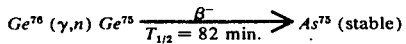  1.

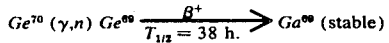  2.

When the irradiation duration is set to last for ten minutes and after the complete decay of the radioactive isotopes so-produced, the following dopant concentrations in the germanium rod beneath the irradiated surface thereof are produced:
1. 1.14 × 10$^{12}$ atoms As/cm$^3$
2. 2.11 × 10$^{12}$ atoms Ga/cm$^3$.

Such arsenic atoms yeild n-doping and gallium atoms yield p-doping, after balancing the foregoing values, 9.7 × 10$^{11}$ atoms Ga/cm$^3$ remain within the germanium rod to provide p-doping.

In the above example, the following dopant parameters are required:
Initial value: 2.4 × 10$^{13}$ cm$^{-3}$ $\simeq$ 47 $\Omega$ cm
Target value: 2.75 × 10$^{14}$ cm$^{-3}$ $\simeq$ 8.75 $\Omega$ cm
To be produced: 2.56 × 10$^{14}$ cm$^{-3}$.

The irradiation duration required to produce a p-doped germanium rod having the above desired resistance is about 44 hours.

Suitable apparatuses for conducting the irradiation of bodies with $\gamma$-photons are known. For example van de Graaff-generators, cyclotrons, linear accelerators and/or nuclears reactors may be used in the practice of this invention.

Since $\gamma$-photon radiation may cause damage to a crystal lattice irradiated thereby, it is suggested that the irradiated semiconductor body be annealed for at least one hour at temperatures above about 500° C. so as to heal any damage to the crystal lattice thereof. In instances where the irradiated body is composed of silicon, the annealing is preferably conducted in a silicon tube. However, this annealing step may be dispensed with if the irrdiated semiconductor body is to be further processed to form electrical components and at least one high temperature process is conducted during the further processing of such components.

In one preferred embodiment of the invention, the semiconductor material is formed into a rod and positioned across a $\gamma$-photon stream and the semiconductor rod is then rotated about its longitudinal axis during the irradiation process to insure that all portions of the rod are uniformly subjected to the $\gamma$-photons. For example, a polycrystalline silicon rod having a length of 900 mm and a diameter of 35 mm may, for example, be used as an initial material. Such an initial rod is preferably zone melted in a vacuum and subsequently or simultaneously a seed crystal having (111)-orientation is fused onto it so that a monocrystalline rod therefrom can be formed.

In accordance with another embodiment of the invention, the select semiconductor material is formed into a crystalline wafer and an x-y scanning of such wafer with a $\gamma$-photon beam is effected during the irradiation process.

The invention provides, for example, silicon, germanium, gallium arsenide or gallium arsenide phosphide crystal bodies having a homogeneous p-doping therein. Such crystals are particularly useful for the production of electronic semiconductor components.

The advantages of the invention, in comparison with known doping processes, are clearly shown by the greater homogeneity of dopant concentration in the resultant crystals and by the avoidance of any high temperature processing and the unfavorable consequences thereof.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appendant claims.

We claim as our invention:
1. A process of producing substantially homogeneously doped p-conductive semiconductor materials comprising irradiating a body composed of a select semiconductor material with a $\gamma$-photon stream and triggering nuclear reactions within said material to produce p-doping atoms.

2. A process as defined in claim 1 wherein said semiconductor material is silicon and the nuclear reactions produce aluminum atoms within the silicon body in accordance with the reaction:

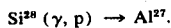

3. A process as defined in claim 1 wherein said semiconductor material is germanium and the nuclear reactions produce gallium atoms within the germanium body in accordance with the reaction:

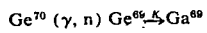

wherein K is nuclear radiation.

4. A process as defined in claim 1 wherein said semiconductor material is a compound selected from the group consisting of gallium arsenide, gallium phosphide and gallium arsenide phosphide and the nuclear reactions produce zinc atoms within such body in accordance with the reaction:

5. A process as defined in claim 1 wherein the irradiation of the semiconductor body with a $\gamma$-photon stream includes controlling the duration of irradiation and controlling the density of the γ-photon stream per unit area.

6. A process as defined in claim 1 including annealing the irradiated semiconductor body for at least one hour at a temperature above 500° C. so as to heal any damage to the crystal lattice thereof caused by the irradiation process.

7. A process as defined in claim 1 wherein said semiconductor body is in the form of a rod and said rod is rotated about a longitudinal axis thereof during the irradiation process.

8. A process as defined in claim 1 wherein said semiconductor body is in the form of a crystalline wafer and an x-y scanning of said wafer with a γ-photon beam is effected during the irradiation process.

* * * * *